United States Patent [19]

Schumann et al.

[11] Patent Number: 4,851,361
[45] Date of Patent: Jul. 25, 1989

[54] FABRICATION PROCESS FOR EEPROMS WITH HIGH VOLTAGE TRANSISTORS

[75] Inventors: Steven J. Schumann, Santa Clara; John Y. Huang, Fremont, both of Calif.

[73] Assignee: Atmel Corporation, San Jose, Calif.

[21] Appl. No.: 152,313

[22] Filed: Feb. 4, 1988

[51] Int. Cl.[4] .................. H01L 21/265; H01L 29/78; H01L 29/94; H01L 29/96

[52] U.S. Cl. .................................. 437/030; 437/43; 437/52; 437/57; 437/58; 357/23.5

[58] Field of Search .................. 437/43, 52, 27, 28, 437/29, 30, 57, 58; 357/23.5

[56] References Cited

U.S. PATENT DOCUMENTS

| | | | |
|---|---|---|---|
| 4,258,465 | 3/1981 | Yasui et al. | 437/43 |
| 4,490,900 | 1/1985 | Chin | 357/24 |
| 4,517,732 | 5/1985 | Oshikawa | 437/52 |
| 4,598,460 | 7/1986 | Owens et al. | 437/52 |
| 4,622,656 | 11/1986 | Kamiya et al. | 357/23.5 |
| 4,688,078 | 8/1987 | Hseih | 357/23.5 |
| 4,701,776 | 10/1987 | Perlegos et al. | 357/23.5 |

OTHER PUBLICATIONS

Ken Yu et al., "HMOS-CMOS—A Low-Power High-Performance Technology", *IEEE Journal of Solid-State Circuits*, vol. SC-16, No. 5, Oct., 1981, pp. 454–459.

Primary Examiner—Olik Chaudhuri
Attorney, Agent, or Firm—Thomas Schneck

[57] ABSTRACT

A CMOS fabrication process for EEPROMs having high-breakdown-voltage peripheral transistors in which a single implant step early in the process forms buried implants for both the memory cell's tunnel area source and the high voltage transistor's source and drain areas. The single implant step can be formed either before or after the formation of the channel stops and field oxide around the devices. The floating gate of the memory cell and the gates of the other devices are formed with polysilicon, the gates of the high voltage transistor overlapping the buried implants of its source and drain. The sources and drains of the other peripheral devices are then formed, using their polysilicon gates as a self-aligning mask. This may also include the formation of contact source and drain for the high voltage transistor. The process concludes with the formation of one or two layers of conductive lines connecting to specified drains, sources and gates to form a desired circuit pattern.

13 Claims, 8 Drawing Sheets

FABRICATION PROCESS FOR EEPROMS WITH HIGH VOLTAGE TRANSISTORS

TECHNICAL FIELD

The present invention relates to fabrication of electrically erasable programmable read-only memory (EEPROM) devices, especially devices which include high-breakdown-voltage peripheral transistors, and in particular to fabrication processes using complementary metaloxide-semiconductor (CMOS) technologies.

BACKGROUND ART

Read-only memory (ROM) devices are commonly fabricated by employing metal-oxide-semiconductor (MOS) devices as the memory cells in a memory cell array. Each MOS device can be turned on by applying a voltage higher than its threshold voltage to a gate. To write into ROMs, ion implantation or other techniques are employed during fabrication to alter the threshold voltage of MOS devices representing particular memory cells. A desired program is thus stored in the ROM device. However, this method does not offer enough flexibility for most applications because the ROM is programmed in the middle of the overall fabrication process, and it typically takes from one-half to one month more to complete the rest of the process. Further, changes in the ROM program require a change in the ROM code mask used in the fabrication process.

Erasable programmable ROM (EPROM) devices are ROMs, but unlike ordinary ROM and PROM devices in which information cannot be changed once written, the information stored on EPROMs can be erased and rewritten. EPROMs use floating gate avalanche injection MOS (FAMOS) devices as the memory cells. In FAMOS devices, a floating gate, completely insulated by silicon dioxide, is placed underneath an ordinary gate. The floating gate can store charge which determines the threshold voltage and therefore the ON/OFF state of the device. A FAMOS device with its floating gate neutrally charged has a low threshold voltage and can be turned "ON" easily. As a result, the memory cell stores information "1". When electrons are injected into the floating gate through a thin insulation layer from the substrate, the floating gate becomes negatively charged. Since the floating gate is surrounded by the insulation layer, the electrons, once trapped, stay inside the floating gate during normal storage and operating conditions. A FAMOS device with a negatively charged floating gate has a higher threshold voltage, and so it stays "OFF" during normal operation. As a result, the memory cell stores information "0".

EPROMs are erased by flood exposure to ultraviolet light. Ultraviolet light with high enough energy excites the electrons to escape from the floating gates and also temporarily increases the conductivity of the gate oxide. Bathing the EPROM in the correct wavelength and intensity of ultraviolet light therefore lets the stored charge leak off the floating gates, causing the gates to return to an uncharged state. After about twenty minutes, information stored in all memory cells is completely purged. New information can then be written electrically into each memory cell.

Memories can be made to erase electrically by further introducing a small window with a very thin dielectric layer between the floating gate and the substrate. An implant in the substrate beneath the window area is used to provide a source for tunneling. Electrons can be injected into and withdrawn out of the floating gate through the small window by tunneling effects when voltages are applied across the thin dielectric layer. Memories with this capability are called electrically erasable programmable ROM (EEPROM) devices.

Like other ROMs, EEPROMs include, besides an array of memory cells, addressing circuitry with peripheral transistors for providing access to specific memory cells so as to enable the contents of the memory cells to be read out, or erased and rewritten. Some of these peripheral transistors, such as those controlling erasure and writing, may be required to have a high breakdown voltage, while others, used only for reading data and operating at normal signal voltages, may be allowed to have lower breakdown voltages. Grounded gate junction breakdown is due to several factors, including the gate oxide thickness, the junction impurity concentration and the junction depth. Generally, devices with a thicker gate oxide, lower impurity concentration and deeper junction have a higher breakdown voltage. In a typical process for making high breakdown voltage peripheral transistors, a phosphorus implant is performed at the drains of these transistors. The implant is then followed by a high temperature drive-in to diffuse the phosphorus under the edge of the polysilicon gate. Typical dose and depth of the implant are $5 \times 10^{15}/cm^2$ and 0.5–1.5 $\mu$m, respectively, and the resulting breakdown voltage is about 16–25 V. Unfortunately, the high temperature drive-in degrades the performance of other peripheral transistors. Additionally, one extra mask and one extra implant step are needed to make a high breakdown voltage device. Furthermore, for EEPROMs, a breakdown voltage of at least 20 V is desired.

It is an object of the present invention to provide a fabrication process for EEPROMs including high voltage peripheral transistors which have a breakdown voltage of at least 20 V, and which does not require an extra mask and a separate drive-in step that could degrade performance of other devices.

Another object of the present invention is to provide a fabrication process for EEPROMs with large tolerance latitudes in the process so as to produce good quality EEPROMs with high yield.

DISCLOSURE OF THE INVENTION

The above objects have been met with an EEPROM fabrication process in which a single implantation step is performed for both the tunnel area source of the memory cell and the drain and source areas of high-breakdown-voltage peripheral transistors, the implants being formed prior to the formation of any polysilicon gates. The process, starting with a P-type substrate, begins by forming an N-well in the substrate. The above mentioned implantation step is a low dose $(0.5–5.0 \times 10^{14}/cm^2)$ of an N-type impurity, such as arsenic, done after N-well formation. The above mentioned implant step can be performed either before or after the formation of channel stop and field oxide around device areas. Since the implantation is done early in the process, the implant can be driven in by later steps without affecting other peripheral transistors and the implant goes deeper resulting in a higher breakdown voltage (20–30 volts).

The channel stops and field oxide may be formed around device areas by first thermally growing a thin oxide layer, depositing a thick nitride layer, removing this nitride from defined non-device areas, implanting boron ions around the N-well and N-channel device areas, then driving in the boron and thermally growing field oxide in areas not covered by the nitride layer. Next, a first oxide layer is thermally grown and a window hole is opened in this layer over the implant corresponding to the memory cell area. A thin oxide layer is regrown in the window. A 2500–3400 Å thick layer of polycrystalline silicon ("polysilicon") is then deposited and selectively removed to form the floating gate. A second oxide layer is thermally grown with a substantially uniform thickness over both the polysilicon floating gate and the substrate, then after adjusting the threshold of any enhancement devices, a second gate layer, of either polysilicon or a polysilicon/silicide sandwich, is deposited and selectively removed with the second oxide layer to define gates. The gates of the high voltage transistors are made to overlap the source and drain implants previously formed. Sources and drains of ordinary peripheral transistors, as well as contact sources and drains for high voltage transistors, are formed using the polysilicon gates as a self-aligning mask. The process concludes by forming one or two layers of conductive lines connecting in a specified circuit pattern to selected sources, drains and gates.

This process requires only a single implant step for both the tunnel area and high voltage transistors. Since this implant is made before the polysilicon gates are deposited, there is no need for a high temperature drive-in. Instead, the implant is made to overlap where the edges of the polysilicon gates will be. Also, because implantation is prior to gate formation, the implant does not have to be heavy, so the junction capacitance may be kept low. By extending the implant under the polysilicon gate at both the source and drain, the channel length of the high voltage devices is made alignment insensitive, this length being determined by the spacing between that said single implant.

BEST MODE FOR CARRYING OUT THE INVENTION

Figure 1:
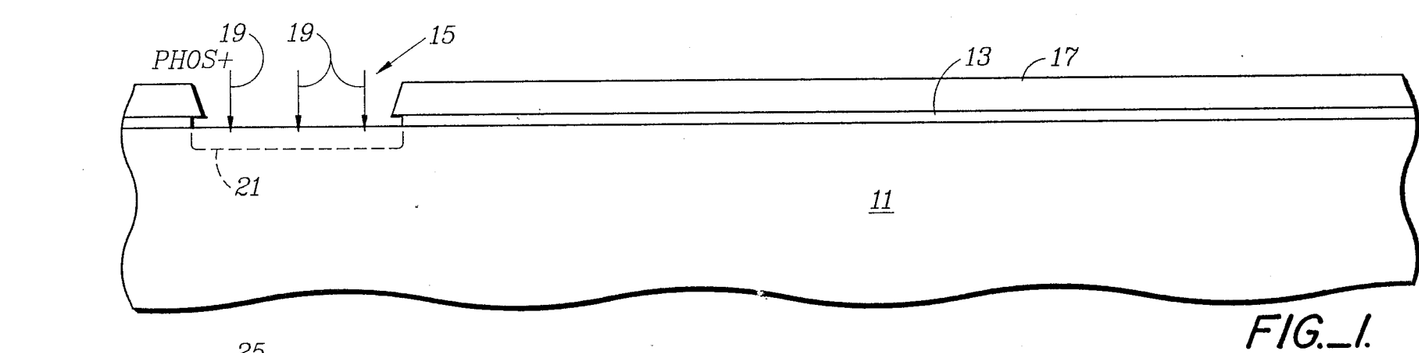
FIGS. 1–16 are side sectional views of a portion of a wafer showing the process steps of the present invention for forming an N-channel device, a P-channel device, a memory cell and a high voltage transistor in an EEPROM.

With reference to FIG. 1, the starting material is a P-type (100)-oriented monocrystalline silicon substrate 11 doped to a level sufficient to provide a resistivity in the range of 5–50 ohm-cm. To reduce power dissipation of circuits, a CMOS process with N-channel memory cells is employed in this invention. After extensive cleaning steps, a silicon dioxide film 13 is thermally grown to a thickness of 2000–8000 Å. The oxidation temperature of this process is about 850°–1000° C. in a steam ($H_2/O_2$) atmosphere. This oxide layer 13 is used to define an N-well area 15 with an N-well photoresist mask 17. Oxide layer 13, through regular photolithographic techniques, is etched off in N-well area 15 with a buffer oxide etchant to form a mask for the subsequent phosphorus ion implantation, indicated by arrows 19 and implant boundary 21. The implant dose level is $3-6 \times 10^{12}/cm^2$ within the implant energy range of 50–300 keV.

Figure 2:
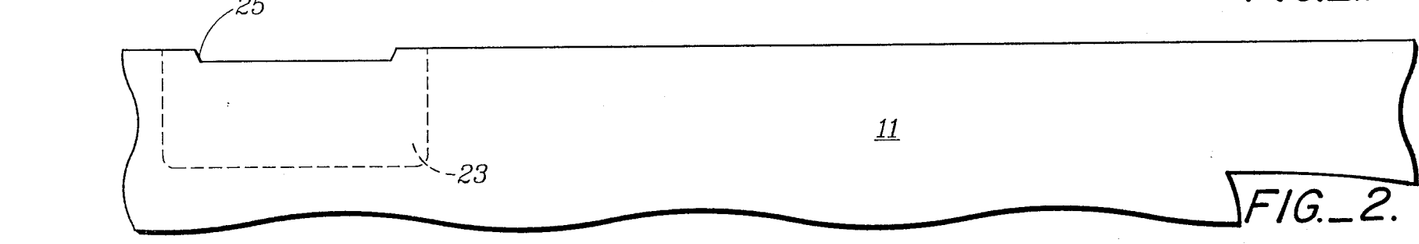

After the ion implantation step, the resist 17 is stripped and the wafer substrate 11 is subjected to a high temperature drive-in treatment at 1100°–1200° C. for 8–12 hours. This drive-in forms an N-well region 23, seen in FIG. 2, with a depth of approximately 3–4 μm and with a phosphorus surface concentration of about $0.7-1.9 \times 10^{16}/cm^3$. During or after N-well drive-in, a silicon dioxide film of 3000–7000 Å thickness is thermally grown at 875°–1000° C. and etched to dewet to generate a silicon step 25 for alignment in the subsequent photolithographic procedures. The remaining oxide film 13 is then removed with a buffered oxide etchant (BOE), and the substrate 11 is subjected to extensive cleaning. The condition shown in FIG. 2 is the result.

Approach Number 1

Figure 3:
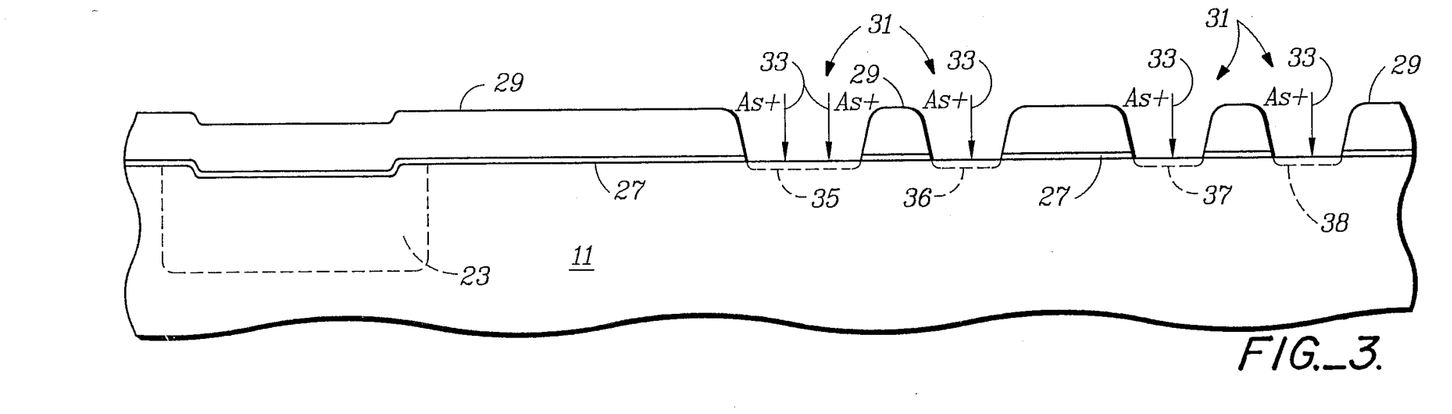

With reference to FIG. 3, the substrate 11 is subjected to a temperature of 900°–1000° C. in an $O_2$ ambient to form a masking oxide layer 27 of 150–250 Å thickness. A photoresist mask 29 is used to define buried N+ regions 31, and the oxide 27 over these defined regions 31 is etched away. The buried N+ regions 31 are then formed by implanting As, as indicated by arrows 33 and implant boundaries 35–38. The implant dose is $0.5-3.0 \times 10^{14}/cm^2$. Then the photoresist layer is stripped off.

Implants 35–38 are formed for both the memory cell (implants 35 and 36) and the high voltage transistor (implants 37 and 38). Since implantation is performed prior to formation of polysilicon gates, the implant dose can be low compared to prior art implants for high voltage transistors The implant boundaries 37 and 38 are made to overlap the future location of polysilicon edges.

Figure 4:
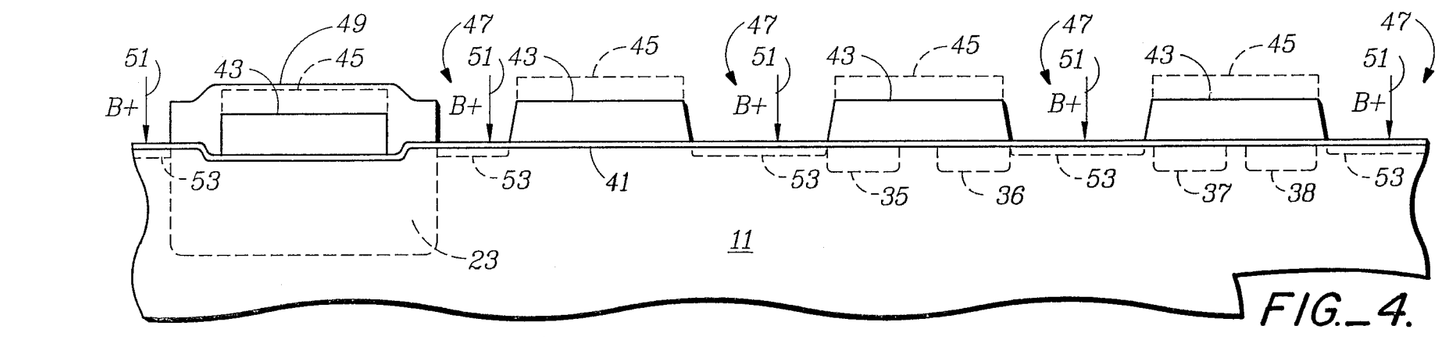

With reference to FIG. 4, the substrate 11 is then subjected to an $O_2/HCl$ ambient at 900°–1000° C. to thermally grow a silicon dioxide layer 41 of 250–1000Å-thickness. On top of this oxide 41, a silicon nitride film 43 of 1000–2500 Å thickness is deposited by a low pressure chemical vapor deposition (LPCVD) method. Then, through a photolithographic step using a photoresist mask 45 this silicon nitride layer 43 is etched to define active regions. The etching is done by a plasma chemistry technique using $SF_6$ or $CF_4/O_2$ as the etchant. The silicon dioxide layer 41, grown prior to the silicon nitride deposition, assures that wafer substrate 11 is free from possible point defects or line defects, such as dislocation and subgrain boundaries, induced by the large built-in stresses ($>2 \times 10^{19}$ $dyn/cm^2$) of silicon nitride films. The thickness ratio of silicon nitride to silicon dioxide should be in the range from 1:1 to 7:1 to minimize the stress.

After removal of resist 45 and cleaning, another other photolithographic step is employed in which field stop implant regions 47 are defined by a photomask 49. Photomask 49 is used principally to cover the N-well region 23 prior to N-channel stop formation. The channel stop is formed by implanting boron ions into the substrate followed by a field oxidation cycle. Field boron implantation is indicated in FIG. 4 by arrows 51 and implant boundaries 53. The implant dose is about $1-4 \times 10^{13}/cm^2$, and an implantation energy within the approximate range of 25–50 keV is used. The reason for using a low voltage for this implantation is to prevent boron ions from penetrating through the silicon nitride layer 43 then into the substrate 11. Nitride layer 43 is generally thicker than that used in the prior art. Resist layer 49 is stripped after implantation.

Figure 5:
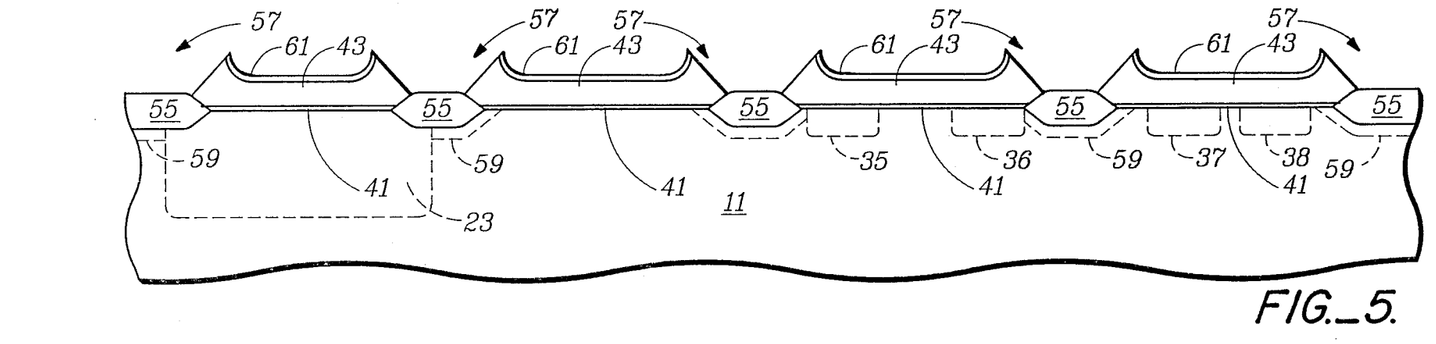

Following boron implantation, a field oxidation cycle is performed. As a result of this cycle, a 0.9–1.7 μm thick field oxide layer 55, seen in FIG. 5, is grown in the isolation areas 57 using the patterned nitride layer 43, as an oxidation mask. It is desirable that the field oxide 55 and channel stop regions 59, also seen in FIG. 5, be formed at the same time. Therefore, the field oxidation cycle includes both a high temperature (1000°–1100° C.) boron drive-in step in an $N_2$ ambient and a lower temperature (925°–975° C.) oxidation step in a steam ($H_2/O_2$) ambient. The drive-in prior to oxidation is necessary to prevent boron in stop regions 59 from being leached out in the subsequent oxidation cycles. This drive-in step also drives in the arsenic implants 35–38 formed previously for the memory cell and high voltage transistors.

Figure 6:
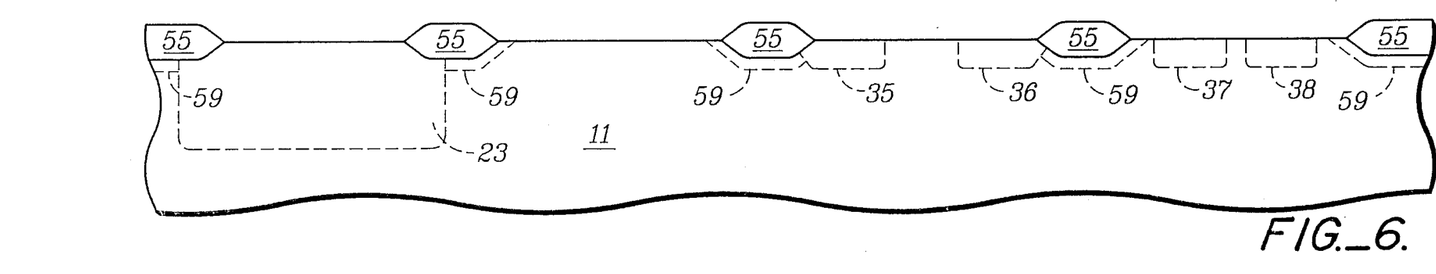

A thin silicon dioxide layer 61 is formed on the top of silicon nitride layer 43 during the field oxidation process, the top surface of silicon nitride layer 43 being converted to silicon dioxide due to the long hours process in the steam environment. The thickness of this silicon dioxide layer 61 is about 1–4% of the thickness of the field oxide 55. Thus top oxide layer 61 needs to be removed before the silicon nitride strip. About 250–800 Å of silicon dioxide is etched off using BOE solution followed by stripping the silicon nitride layer 43 in phosphoric acid at an etch rate of 60–100 per minute. Lastly, the 250–1000 521 thick bottom oxide layer 41 that was under the nitride layer 43 is removed, followed by extensive wafer cleaning. The condition shown in FIG. 6 is the result. Then the wafer is ready for the first gate oxidation step described below with reference to FIG. 7.

Approach Number 2

Figure 4A:
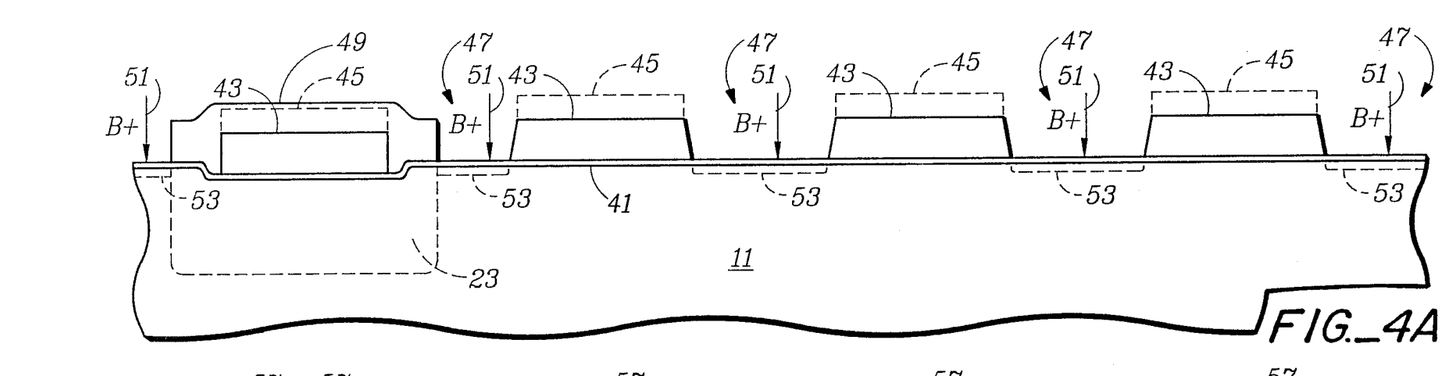

With reference to FIG. 4A, the substrate 1 is then subjected to an $O_2/HCl$ ambient at 900°–1000° C. to thermally grow a silicon dioxide layer 41 of 250–1000 Å thickness. On top of this oxide 41, a silicon nitride film 43 of 1000–2500 Å thickness is deposited by a low pressure chemical vapor deposition (LPCVD) method. Then, through a photolithographic step using a photoresist mask 45 this silicon nitride layer 43 is etched to define active regions. The etching is done by a plasma chemistry technique using $SF_6$ or $CF_4/O_2$ as the etchant. The silicon dioxide layer 41, grown prior to the silicon nitride deposition, assures that wafer substrate 11 is free from possible point defects or line defects, such as dislocations and subgrain boundaries, induced by the large built-in stresses ($>2\times10^{19}$ dyn/cm$^2$) of silicon nitride films. The thickness ratio of silicon nitride to silicon dioxide should be in the range from 1:1 to 7:1 to minimize the stress.

After removal of resist 45 and cleaning, another photolithographic step is employed in which field stop implant regions 47 are defined by a photomask 49. Photomask 49 is used principally to cover the N-well region 23 prior to N-channel stop formation. The channel stop is formed by implanting boron ions into the substrate 11 followed by a field oxidation cycle. Field boron implantation is indicated in FIG. 4A by arrows 51 and implant boundaries 53. The implant dose is about $1-4\times10^{13}$/cm$^2$, and an implantation energy within the approximate range of 25–50 keV is used. The reason for using a low voltage for this implantation is to prevent boron ions from penetrating through the silicon nitride layer 43 then into the substrate 11. Nitride layer 43 is generally thicker than that used in the prior art. Resist layer 49 is stripped after implantation.

Figure 5A:
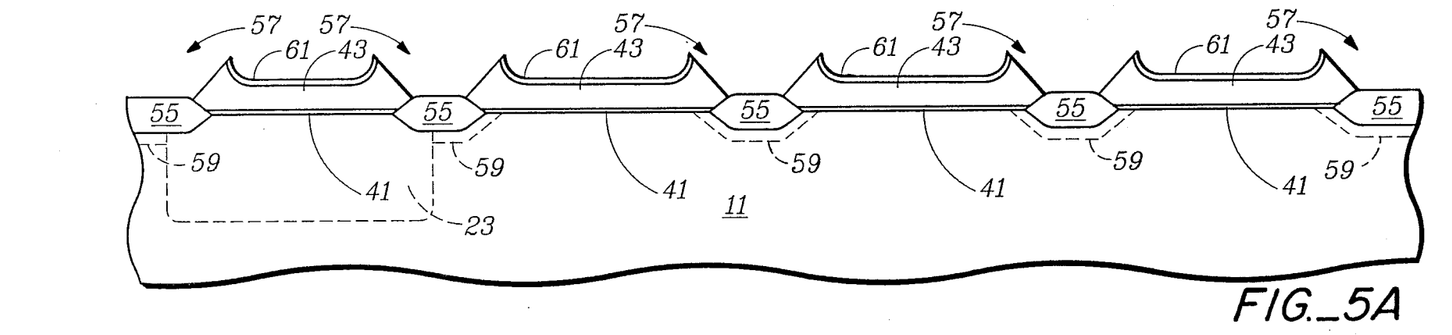

Following boron implantation, a field oxidation cycle is performed. As a result of this cycle, a 0.9–1.7 $\mu$m thick field oxide layer 55, seen in FIG. 5A, is grown in the isolation areas 57 using the patterned nitride layer 43, as an oxidation mask. It is desirable that the field oxide 55 and channel stop regions 59, also seen in FIG. 5, be formed at the same time. Therefore, the field oxidation cycle includes both a high temperature (1000°–1100° C.) boron drive-in step in an $N_2$ ambient and a lower temperature (925°–975° C.) oxidation step in a steam ($H_2/O_2$) ambient. The drive-in prior to oxidation is necessary to prevent boron in stop regions 59 from being leached out in the subsequent oxidation cycles.

Figure 6A:
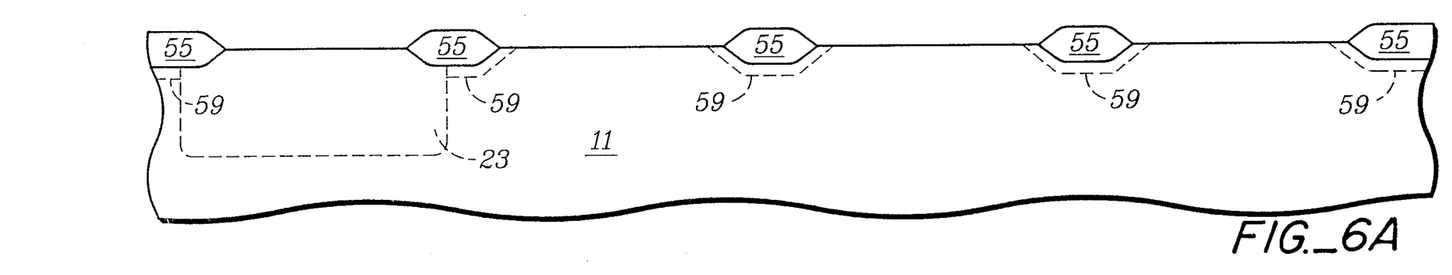

A thin silicon dioxide layer 61 is formed on the top of silicon nitride layer 43 during the field oxidation process, the top surface of silicon nitride layer 43 being converted to silicon dioxide due to the long hours process in the steam environment. The thickness of this silicon dioxide layer 61 is about 1–4% of the thickness of field oxide 55. Thus top oxide layer 61 needs to be removed before the silicon nitride strip. About 250–800 Å of silicon dioxide is etched off using BOE solution followed by stripping the silicon nitride layer 43 in phosphoric acid at an etch rate of 60–100 Å per minute. Lastly, the 250–1000 Å thick bottom oxide layer 41 that was under the nitride layer 43 is removed, followed by extensive wafer cleaning. The condition shown in FIG. 6A is the result.

Figure 6B:
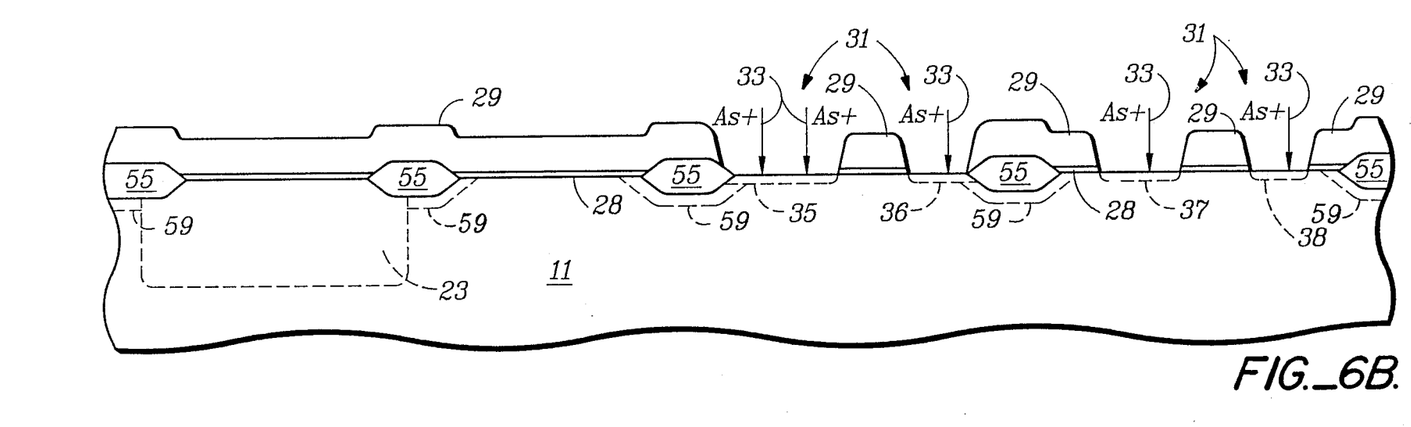
Figure 6C:
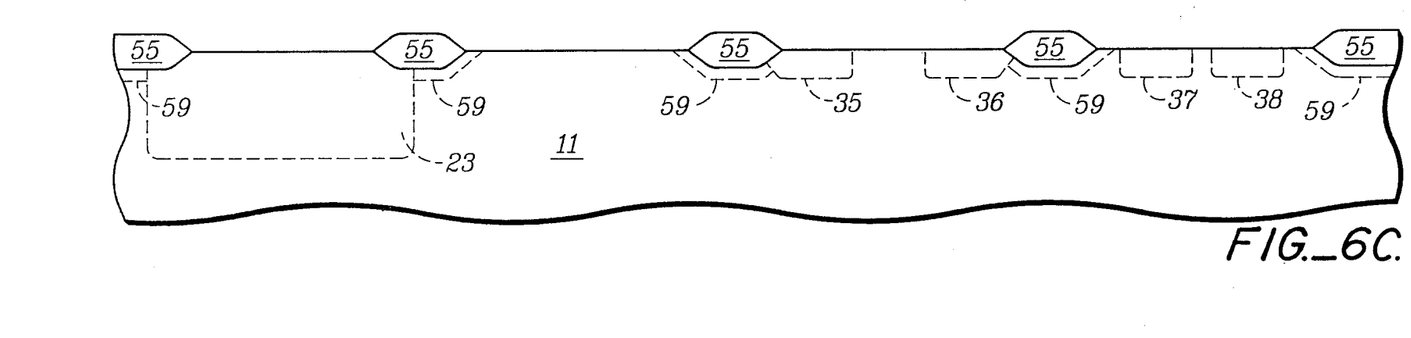

The wafer is then subject to a thin oxidation to form an oxide layer of 100–400 Å for masking oxide layer 28. A photoresist mask 29 is used to define buried N+regions 31, and the oxide 28 over these regions 31 are etched away. The buried N+regions 31 are then formed by implant As as indicated by arrows 33 and implant boundaries 35–38 in FIG. 6B. The implant dose is $0.5-3.0\times10^{14}$/cm$^2$. Following the implantation and resist removal, a buffed oxide etch is used to strip off oxide layer 28 to bare silicon. The condition shown in FIG. 6C is the result. Then the wafer is ready for the first gate oxidation step described below with reference to FIG. 7.

Figures 7, 8:
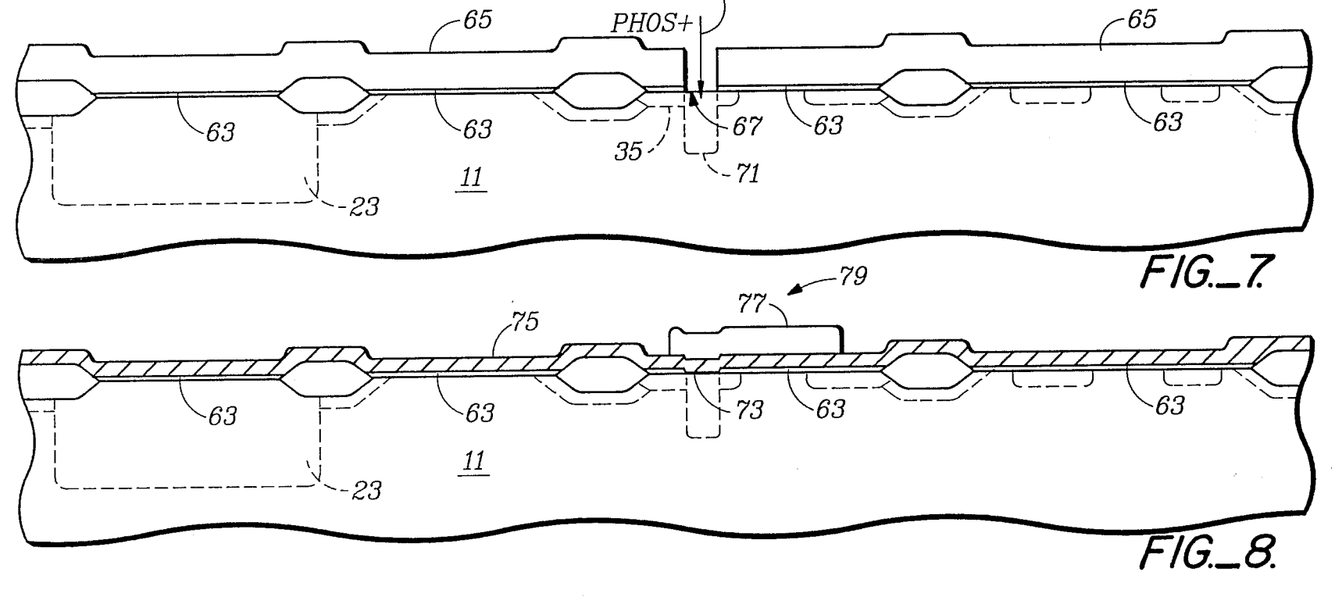

With reference to FIG. 7, the first gate oxidation 63 is grown by exposing the substrate 11 to an alternating $O_2/HCl$ and $O_2/N_2$ atmosphere at 1000°–1100° C. The thickness of this layer 63 is 250–750 Å, and preferably about 400 Å. The first gate oxide 63 will be used in a memory cell. Standard photolithographic procedures, using a photoresist mask 65 and buffered oxide etchant, are used to open a small window 67 in oxide layer 63 over buried N+region 35. Phosphorus ion are implanted through windows 67, as indicated by arrow 69 and implant boundary 71, with a dose level of $5.0-9.0\times10^{13}$/cm$^2$. The resist is then removed, and the substrate is cleaned very carefully. An oxidation cycle at 800°–950° C. in an $O_2/N_2/HCl$ ambient is subsequently applied to form a thin silicon dioxide layer 73, seen in FIG. 8, of 60–100 Å thickness in window 67. This is followed by a heat treatment at 1000°–1050° C. in an $N_2$ atmosphere to strengthen the oxide 63 and 73.

In FIG. 8, a low pressure chemical vapor deposition (LPCVD) polycrystalline silicon layer 75 of 2500–3400 Å thickness, and preferably less than 3200 Å thick, is formed over the oxide 63 and 73. The major gas used in this deposition step is $SiH_4$ (Silane), and the deposition temperature is 600°–700° C. Polysilicon layer 75 is thinner than the approximately 4000 Å thick polysilicon layers found in the prior art. Polysilicon layer 75 is doped to achieve the desired sheet resistance. A $P_2O_5$ film is grown over layer 75 by employing $POCl_3$ and $O_2/N_2$ at a temperature of 900°–950° C. $PH_3$ (phosphine) may also be used. A sheet resistance of 20–40 ohm/square is achieved through this doping step. A buffered oxide etch is applied to remove the phosphorus glass that forms over the polysilicon during doping.

Figure 9:
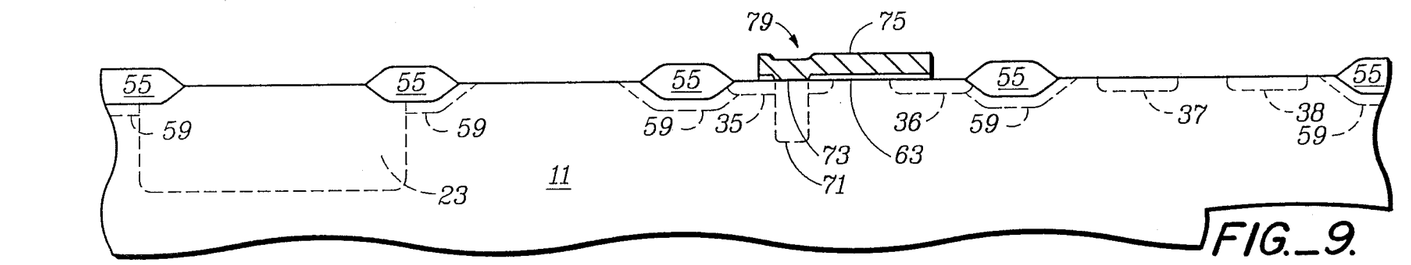

A photoresist layer 77 is next placed on the polysilicon film 75, and using regular photolithographic techniques, a floating gate area 79 for a memory cell is defined Polysilicon layer 75 is then etched off the non-floating gate areas not covered by resist 77 by using a plasma etch. A typical plasma chemistry chosen for this step is $CCl_4/SF_6$, $Cl_2/O_2$ or $SF_6/O_2$. After etching, resist 77 is stripped, then oxide layer 63 is removed with an oxide dipout step from all wafer areas not covered by the remaining polysilicon 75 in floating gate area 79, which serves as a mask. The wafer is then subject to extensive cleaning steps. The condition shown in FIG. 9 is the result.

Figure 10:
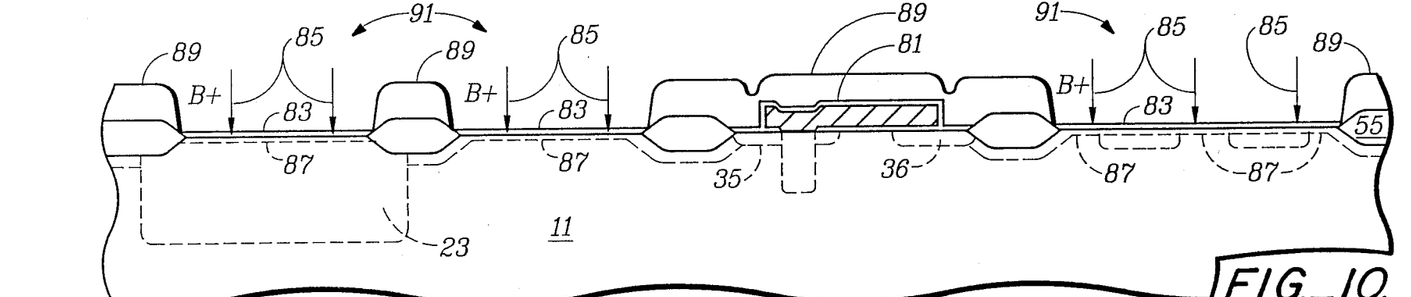

With reference to FIG. 10, the wafer is then subjected to a high temperature oxidation cycle to form the interpoly dielectric layer 81 as well as the gate oxide 83 for peripheral devices (both P-channel and N- channel). This second gate oxide 81 and 83 is grown in $O_2/N_2$ atmosphere at a temperature of 1000°–1050° C. The thickness of these silicon dioxide layers 81 and 83 is between 250 Å and 360 Å. The reason for using high temperatures is to achieve better control of the relative growth rate of silicon dioxide over the polysilicon gate and the monocrystalline silicon substrate. The conventional dry oxidation process, which usually uses lower temperatures of 900°–1000° C., would grow much more oxide on polysilicon than over the substrate. The $O_2/N_2$ mixture is used to reduce the oxidation rate at these high temperatures to a reasonable and controllable rate.

To adjust the threshold voltage of enhancement devices, a boron ion implantation of dose level $6-10 \times 10^{11}/cm^2$ at 40–80 keV is employed, represented by arrows 85 and implant boundaries 87 in FIG. 10, for both P-channel and N-channel devices. Ordinary photo-lithographic techniques may be employed, using a photomask 89, to define areas 91 for threshold adjustment. Alternatively, implantation may take place without mask 89, mask 89 being optional. If mask 89 is used, it is subsequently stripped after implantation, and the wafer is cleaned.

Figure 11:
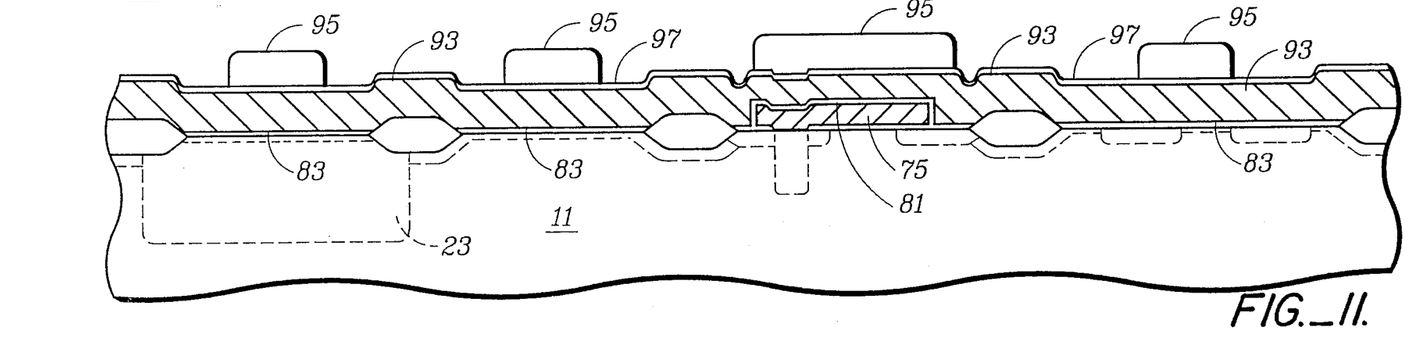

With reference to FIG. 11, a second polysilicon film 93 is applied over interpoly dielectric layer 81 and second gate oxide 83. The low pressure chemical vapor deposition (LPCVD) process used is similar to the deposition of the first polysilicon layer 75 in FIG. 8 used to form floating gate 79. The thickness of this second polysilicon layer 93 is 4000–4900 Å thick, standard for the industry. Polysilicon film 93 is then doped with phosphorus to achieve a 15–30 ohm/square sheet resistance. The doping procedure is similar to that for the first polysilicon layer 75, described above, except that a slightly higher temperature of 925°–975° C. is used. BOE is used to remove the phosphorus glass ($P_2O_5$) which is formed during the $POCl_3$ doping step. A silicide/polysilicon sandwich may replace the second polysilicon 93 in some high speed devices, the sandwich reducing the interconnect resistance and thereby improving device speed.

Figure 12:
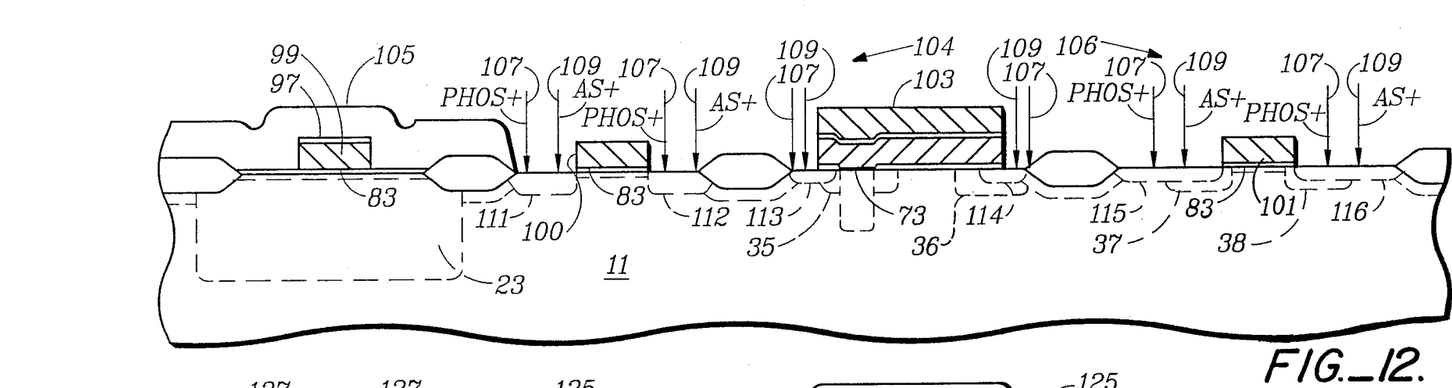

A photoresist layer 95 is used as a mask to define the shape of the second polysilicon layer 93. To promote adhesion of the photoresist 95 to the wafer surface, a layer 97 of silicon dioxide may be grown by the surface oxidation of second polysilicon layer 93. Oxide layer 97 is optional. With photomask 95 in place, oxide layer 97, if any, and second polysilicon layer 93 are etched. Highly anisotropic etching is preferred. The etching chemistry chosen for this step, typically $CCl_4/SF_6$, is similar to the first polysilicon etching in FIG. 8 above. As a result of etching, polysilicon gates 99–101 for peripheral devices, as well as polysilicon control gates 103 for memory cells, seen in FIG. 12, are defined. Mask 95 is subsequently stripped.

Figure 13:
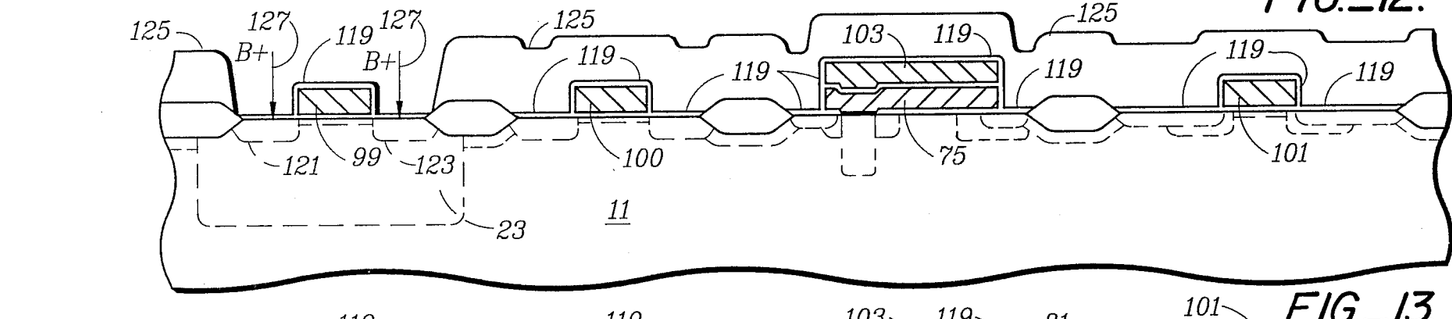

With reference to FIG. 12, to define N-channel source and drain areas, a photomask 105 is placed on the wafer. The wafer is then subjected to a moderate-dose phosphorus ion implantation, indicated by arrows 107, followed by a high-dose arsenic ion implantation, indicated by arrows 109 and N+ implant boundaries 111–116. Phosphorus is implanted to a dose of $0.0-7.0 \times 10^{13}/cm^2$ and is used to create a graded p-n junction Arsenic is implanted to a dose of $1-8 \times 10^{15}/cm^2$ at an implantation energy of about 70–100 keV. Implants 111 and 112 are the source and drain of an ordinary N-channel transistor, implants 113 and 114 are contact source and drain for memory cell 104, and implants 115 and 116 are contact source and drain for high voltage transistor 106. Contact sources and drains extend the sources and drains beyond the buried portions of the sources and drains formed by previous implants 35–38 enabling conductive lines to make contact therewith without shorting with the adjacent gate. By extending the implants 37 and 38 under the polysilicon gate 101, the channel length of high voltage transistor 106 is made alignment insensitive, the length being determined by the spacing between implants 37 and 38. The N+ implant depth is about 0.4 μm after the end of the process. Note that gate oxide layer 83 is removed from the exposed areas above the implantation sites prior to implantation. After the N-channel source and drain areas 111–116 have been implanted, the resist 105 is stripped and a $SiO_2$ oxide layer 119, seen in FIG. 13, is regrown over the areas of exposed substrate. This refill oxidation is formed thermally at 900°–975° C. in an $O_2$ atmosphere. Oxide layer 119 fills up the cavities between polysilicon layers 75 and 103 and between polysilicon 75, 99, 100 and 101 and substrate 11. It also prevents polysilicon edges from low voltage breakdown.

Figure 14:
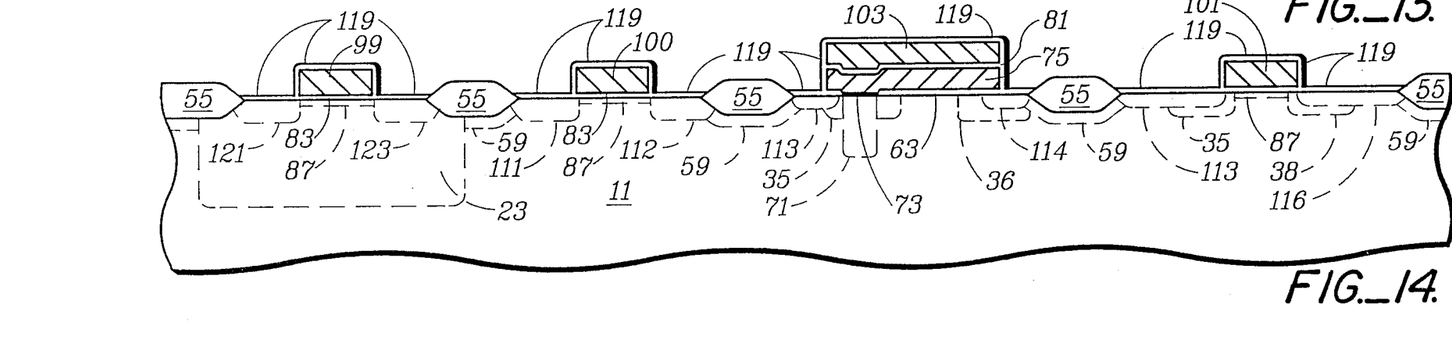

With reference to FIG. 13, P-channel source and drain areas 121 and 123 are defined by another photomask 125. Boron ion implantation is then carried out, as indicated by arrows 127 and implant boundaries 121 and 123, to create the source and drain. The dose is in the range from $1-3 \times 10^{15}/cm^2$, while the implantation energy is about 40–80 keV. The resulting source and drain junctions 111 and 113 are about 0.6 μm deep after the end of the process. Implantation is followed by a resist strip, resulting in the condition shown in FIG. 14.

Figure 15:
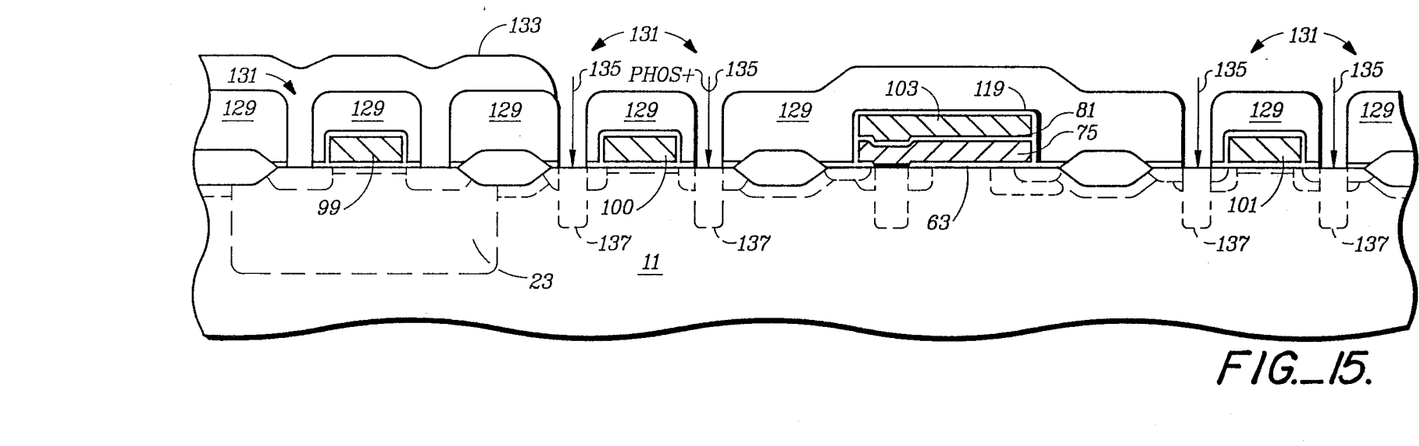

With reference to FIG. 15, a boron/phosphorus doped silica glass (BPSG) layer 129 is next deposited on the wafer using a low pressure chemical vapor deposition technique. The concentration of boron in this glass is 2.0–4.0 wt %, while the concentration of phosphorus is about 4–8 wt %. An advantage of using BPSG over conventional PSG is that the glass flow temperature is lower for the BPSG than the PSG. A high temperature anneal step at 900°–1000° C. in alternating $H_2/O_2$ and $N_2$ ambients is employed to flow the BPSG. The thickness of BPSG layer 129 must be sufficient to cover the very high floating gate stack (Gates 75 and 103 together with oxide layers 63, 81 and 119 have a total thickness of about 9000 Å.) to avoid breakdown at 20–25 Volts between gates 75 and 103 and subsequent metal contacts. The 1.0 to 1.5 μm thick glass 129 is accordingly about twice as thick as that found over other logic products, which need only withstand breakdown to 10 Volts.

A photomask, not shown, is placed over glass layer 129 to define contact holes 131 where metal is to make contact with the substrate 11 or the polysilicon gates 99–101. Plasma etching or reactive ion etching can be used to form holes 131. $CHF_3/O_2$ chemistry is typically used for this purpose Oxygen is added to avoid polymer formation, which may block further etching of the contact holes 131. After the contact hole photomask is stripped, another photomask 133 is applied to cover the P-channel contacts. The substrate 11 is then subjected to phosphorus ion implantation, indicated by arrows 135, to create N+ phosphorus plugs, indicated by implant boundaries 137, for the N-channel contacts. The dose of this implant is $2–8 \times 10^{15}/cm^2$ at an implantation energy of 50–150 keV. After implantation, resist 133 is removed.

At this point, the backside of the wafer is etched to remove the silicon dioxide and polysilicon layers which have accumulated from previous growth and deposition steps. A thick coat of negative resist, 2.0–5.0 μm thick, is applied to protect the front side of the wafer. The backside of the wafer is then subjected to buffered oxide and plasma polysilicon etching clear to the original substrate After backside etching is completed, the protective resist coat is stripped, and the wafer is put through a regular cleaning procedure.

To improve the metal step coverage, the wafer is subjected to a heat treatment at approximately 900°–1000° C. for producing reflow of the etched BPSG layer 121. Alternating $O_2/N_2$ ambients are used for this purpose. The reflow smooths out sharp corners at the top of holes 131. The heat also activates the plug implant doping 137. Wet/dry contact etching may also be used to further round the corners. Prior to metal deposition, the substrate is subjected to a very light buffered oxide etch, so as to etch off the 300–2000 Å of silicon dioxide which is grown during the reflow process.

Figure 16:
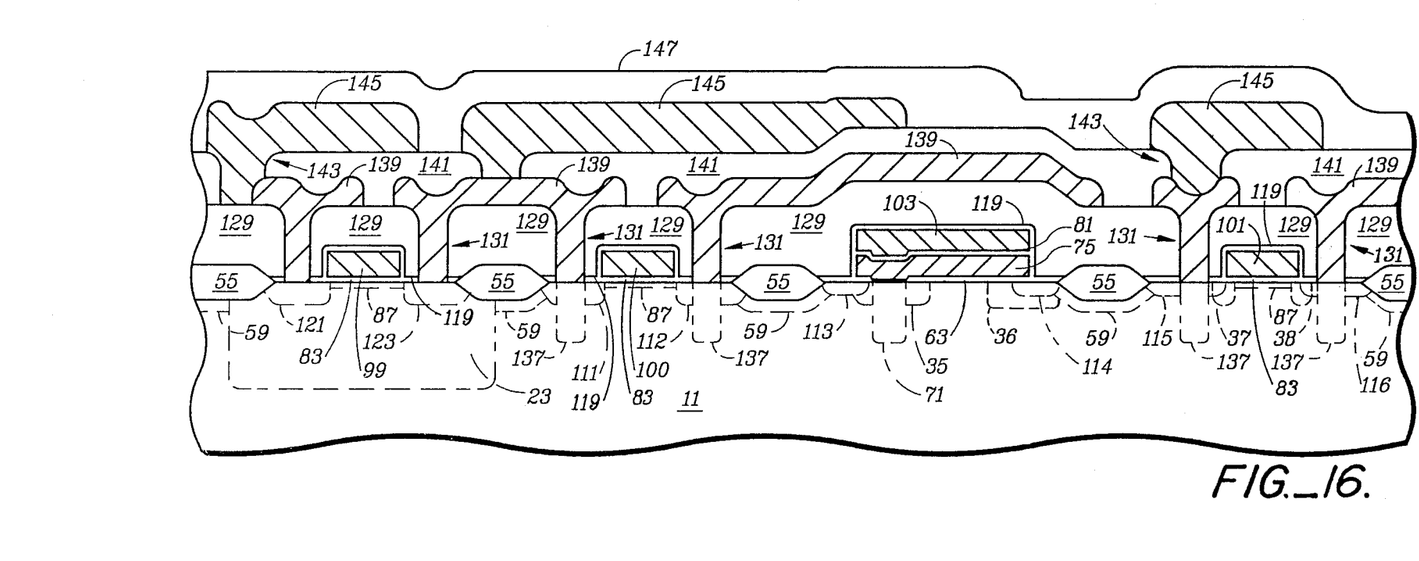

With reference to FIG. 16, an aluminum/silicon layer 139 is deposited on top of the wafer. The metal film 139 is about 0.6–1.2 μm thick and is 0.5–2.0% silicon. Sputtering deposition is used, and the wafer is heated up to 200°–350° C. before sputtering deposition. Employing standard photolithographic techniques, metal connection lines are defined with a photomask, not shown, and then etched using a plasma etching method in a RIE mode. Wet and dry etching gives the connection lines curved edges for better step coverage of the second metal layer. The typical chemistry for the Al/Si etch is $Cl_2$, $BCl_3$ and $0_2$. An additional $CF_4$ plasma post-treatment will be helpful to avoid metal corrosion. Resist is then removed. For example, in FIG. 16 the source or drain 123 of a P-channel device is connected by metal connection lines 139 to a source or drain of an adjacent N-channel device defined by implant 111 and plug 137.

For high speed devices, a double metal process is applied. An intermetal layer 141 of oxynitride, phosphorus-doped silica glass (PSG) or both is deposited over first metal layer 139. The thickness of this layer is about 6000–14000 Å. A planarization process is used to improve coverage in the subsequent second metal step. Etchback and redeposit is the technology used for this purpose. A 60–95% etchback plus redeposit to the desired thickness usually can achieve a reasonably flat wafer surface . Intermetal connect via holes 143 are defined by a photomask, followed by a wet and dry plasma/reactive ion etch and resist strip.

After a pre-deposition back sputter etching of the wafer, a second metal layer 145 is sputtering deposited over intermetal layer 141. The second metal lines are defined in the same manner as the first metal lines, i.e. by means of a photomask and plasma RIE-mode etching. In order to stabilize the surface states between metal 139 and 145 and substrate 11, the wafer is annealed at approximately 380°–450° C. in an $N_2/H_2$ ambient. This process, known as the "alloy process", also serves to alloy the deposited aluminum to the silicon substrate for a good ohmic contact.

A passivation layer 147 is deposited over the second metal layer 145, or for single metal layer devices, over the metal layer 139. Passivation layer 147 comprises a sandwich of oxynitride and phosphorus-doped silica glass (PSG). To form passivation layer 147, PSG is deposited on the wafer by applying an atmospheric pressure chemical vapor deposition technique in silane and oxygen phosphine gases. The concentration of phosphorus in the glass is about 2–4 wt %. and the thickness of this PSG layer is about 1.0–1.3 μm. The oxynitride is deposited over the PSG by using a plasma enhanced chemical vapor technique. The thickness of oxynitride is about 3000–10000 Å with refractive index approximately 1.70–1.74. The resulting passivation layer 147 protects the fabricated integrated circuit on the wafer from moisture and contaminations.

Standard photolithographic techniques are employed to define pad openings, not shown, for probing as well as wire bonding. The oxynitride is plasma etched, while the PSG is etched with a wet oxide etching solution to open these pad areas. After removing the pad mask, a thick negative photoresist coating, 4–10 μm thick, is applied to cover the front side of the substrate. The substrate is then subjected to a backgrinding operation. The final thickness of the wafer is about 300–550 μm. Following resist removal procedures, the wafer is subjected to a light etch in buffered oxide etchant 0.8–1.2% in concentration until the backside is dewet to prepare he backside of the substrate for chrome-gold or gold deposition. After chrome-gold deposition, the device on the substrate is exposed to ultraviolet light to erase or eliminate any possible charging up during the process, and given an electrical test in a probe assembly. The final device is seen in FIG. 16.

We claim:
1. A fabrication process for EEPROMs with high voltage transistors comprising,
  forming an N-well in a P-type substrate,
  implanting an N-type impurity into said substrate in a portion of a memory cell device area and in portions of a high voltage transistor area corresponding to a source and drain thereof,
  forming a floating gate in said memory device area,
  forming control gates for N-channel and P-channel devices and for said memory cell and high voltage transistor services, said control gates being formed after said implanting of said N-type impurity, said control gate of said high voltage transistor overlapping said previously formed N-typed impurity implants in said high voltage transistor area,
  forming additional sources and drains for said devices, said control gates acting as a self-aligning mask, said additional sources and drains including contact sources and drains and drains for said high voltage transistor device overlapping said N-type impurity implants in said high voltage transistor area, and forming one or more layers of conductive lines connecting to selected sources, drains and gates.

2. The process of claim 1 wherein implanting said N-type impurity comprises implanting arsenic to a dose in the range from $0.5 \times 10^{14}/cm^2$ to $3.0 \times 10^{14}/cm^2$.

3. The process of claim 1 wherein said high voltage transistor is characterized by a ground-gate breakdown voltage of at least 20 volts.

4. The process of claim 1 wherein forming said floating gate comprises, thermally growing a first oxide layer on said substrate and opening a window hole therein over said first N-type impurity implant corresponding to said memory cell device, implanting a second N-type impurity in said substrate through said window hole, regrowing a thin oxide layer in said window hole to a thickness of 70-90 Å, depositing a first polysilicon layer over said first oxide layer and said thin oxide layer and selectively removing said first polysilicon layer to form said floating gate disposed over said first oxide layer including said thin-oxide layer, thermally growing a second oxide layer over said floating gate and said substrate, and depositing a second gate layer over said second oxide layer and selectively removing said second gate layer to form said control gates for N-channel and P-channel devices and for said memory cell and high voltage transistor devices.

5. A fabrication process for EEPROMs with high voltage transistors comprising, forming an N-well in a P-type substrate, defining N-channel, P-channel and memory cell device areas in said substrate, said P-channel device areas being defined in said N-well, said N-channel and P-channel device areas including areas for at least one high-breakdown-voltage transistor, forming N-channel stops and field oxide around said device areas, implanting a first N-type impurity into said substrate in a portion of each memory cell device area and in portions of each high-breakdown-voltage transistor area corresponding to a source and drain thereof, thermally growing a first oxide layer on said substrate and opening a window hole therein over said first N-type impurity implant corresponding to said memory cell device, implanting a second N-type impurity in said substrate through said window hole, regrowing a thin oxide layer in said window hole to a thickness of 70-90 Å, depositing a first polysilicon layer over said first oxide layer and said thin oxide layer, selectively removing said first polysilicon layer and said first oxide layer from all areas of said substrate except said memory cell device areas so as to form a floating gate disposed over said first oxide layer including the thin-oxide window region, thermally growing a second oxide layer over said floating gate and said substrate, introducing a threshold adjusting dopant into selected N-channel and P-channel device areas, depositing a second gate layer over said second oxide layer, selectively removing said second gate layer and said second oxide layer so as to form gates for said N-channel devices, P-channel devices, and memory cell devices, the gates of said high-breakdown-voltage transistors overlapping said first N-type impurity impurity implants corresponding to the sources and drains thereof, forming sources and drains for said devices, said gates acting as a self-aligning mask, said sources and drains including contact sources and drains overlapping said sources and drains of said high-breakdown-voltage transistors, and forming a conductive circuit of lines connecting to selected sources, drains and gates.

6. The process of claim 5 wherein forming N-channel stops and field oxide comprises thermally growing a thin silicon dioxide layer with a thickness in the range from 250 to 1000 Å on said substrate, depositing a silicon nitride layer with a thickness in the range from 1000 to 2500 Å on said oxide layer, the thickness ratio of silicon nitride to silicon dioxide being in the range from 1:1 to 7:1, removing said silicon nitride from all areas of said wafer except said device areas, implanting boron ions into said substrate around N-channel device areas and around said N-well, the implantation energy being in the range from 25 to 50 keV, driving in said boron ions and thermally growing oxide in all areas except said device areas covered by said nitride, said driving in step also driving in said first N-type impurity implants, and removing said nitride layer and said thin silicon dioxide layer.

7. The process of claim 5 wherein implanting said first N-type impurity comprises implanting arsenic to a dose in the range from $0.5 \times 10^{14}/cm^2$ to $3.0 \times 10^{14}/cm^2$.

8. The process of claim 5 wherein forming said sources and drains comprises implanting phosphorus to a dose in the range from 0.0 to $7.0 \times 10^{13}/cm^2$ and arsenic to a dose in the range from $1.0 \times 10^{15}/cm^2$ to $8.0 \times 10^{15}/cm^2$ in areas of said substrate adjacent to gates of said N-channel devices, and implanting boron to a dose in the range from $1.0 \times 10^{15}/cm^2$ to $3.0 \times 10^{15}/cm^2$ in areas of said substrate adjacent to gates of said P-channel devices.

9. The process of claim 5 wherein said first gate oxide has a thickness in the range from 250 to 750 Å.

10. The process of claim 5 wherein said at least one high-breakdown-voltage transistor has a grounded gate junction breakdown voltage in a range from 20 to 30 volts.

11. The process of claim 5 wherein said second gate layer is formed of polysilicon.

12. The process of claim 5 wherein said second gate layer is formed of a polysilicon/silicide sandwich for high speed operation.

13. The process of claim 5 wherein the high-breakdown-voltage transistor is formed after field oxidation.

* * * * *

UNITED STATES PATENT AND TRADEMARK OFFICE
CERTIFICATE OF CORRECTION

PATENT NO. : 4,851,361

DATED : July 25, 1989

INVENTOR(S) : Steven J. Schumann et al.

It is certified that error appears in the above-identified patent and that said Letters Patent is hereby corrected as shown below:

Column 1, line 11, "metaloxide-semiconductor" should read
-- metal-oxide-semiconductor --.

Column 4, line 23, "x $10^{14/cm2}$" should read
-- x $10^{14}/cm^2$ --.

Column 4, line 29, "transistors The" should read
-- transistors. The --.

Column 4, line 50, "other" should be deleted.

Column 4, line 55, "substrate" should read -- substrate 11 --.

Column 5, line 20, "of the field oxide" should read
-- of field oxide --.

Column 5, line 24, "60-100 per minute" should read
-- 60-100 Å per minute --.

Column 5, line 25, "250-1000 521" should read
-- 250-1000 Å --.

Column 7, line 41, "photo-lithographic" should read
-- photolithographic --.

Column 8, line 19, "junction Arsenic" should read
-- junction. Arsenic --.

Column 9, line 12, "purpose Oxygen" should read
-- purpose. Oxygen --.

UNITED STATES PATENT AND TRADEMARK OFFICE
CERTIFICATE OF CORRECTION

PATENT NO. : 4,851,361

DATED : July 25, 1989

INVENTOR(S) : Steven J. Schumann et al.

It is certified that error appears in the above-identified patent and that said Letters Patent is hereby corrected as shown below:

Column 10, line 45, "he backside" should read
  -- the backside --.

Claim 1, column 10, line 65, "N-typed" should read
  -- N-type --.

Signed and Sealed this

Twenty-eighth Day of August, 1990

Attest:

HARRY F. MANBECK, JR.

*Attesting Officer*   *Commissioner of Patents and Trademarks*